(12) United States Patent
Tomimori et al.

(10) Patent No.: US 6,592,677 B1
(45) Date of Patent: Jul. 15, 2003

(54) METHOD OF FORMING A SEMICONDUCTOR DEVICE BY SIMULTANEOUSLY CLEANING BOTH SIDES OF A WAFER USING DIFFERENT CLEANING SOLUTIONS

(75) Inventors: Hiroaki Tomimori, Tokyo (JP); Hidemitsu Aoki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 83 days.

(21) Appl. No.: 09/678,608

(22) Filed: Oct. 4, 2000

(30) Foreign Application Priority Data

Oct. 4, 1999  (JP) ............................................. 11-282444

(51) Int. Cl.[7] ................................................. C23G 1/02
(52) U.S. Cl. ................................ 134/3; 134/1.3; 134/2; 134/10; 134/25.1; 427/378; 427/377; 427/443.2; 510/175; 510/181; 510/197
(58) Field of Search ............................ 134/1.3, 3, 102, 134/25.1, 25.4, 109, 108, 111, 99.1; 427/378, 377, 443.2; 510/175, 181, 197, 202

(56) References Cited

U.S. PATENT DOCUMENTS 5,714,203 A * 2/1998 Schellenberger ............ 427/378
6,080,709 A * 7/2000 Ishikawa et al. ............ 510/175
6,117,775 A * 9/2000 Kondo et al. ................ 438/690
6,117,783 A * 9/2000 Small et al. ................. 438/693
6,423,148 B1 * 7/2002 Aoki ............................ 134/28

OTHER PUBLICATIONS

"Monthly Semiconductor World", Apr. 1999, pp. 35–39.

"Technical Materials Edition, Semiconductor Seminar – Problems Point with the Semiconductor Wet Wash Mechanism and the Current State of Wet Washing"; 3. Accomplishment of both high cleansing levels and low cost through highly functional wash materials; pp. 1–3., Apr. 1999.

Advanced electronics series 1–15 "Ultra–clean ULSI technology", pp. 190–195., Nov. 20, 1997.

* cited by examiner

Primary Examiner—Randy Gulakowski
Assistant Examiner—Gentle Winter
(74) Attorney, Agent, or Firm—Young & Thompson

(57) ABSTRACT

The present invention provides a method of removing a Cu-contamination from a wafer surface having a Cu-based metal region, comprising the step of: carrying out a cleaning process by use of a cleaning solution free of HF and capable of oxidation to the wafer surface for not only removing the Cu-contamination from the wafer surface but also oxidizing the wafer surface to cause the wafer surface to have a hydrophilicity.

13 Claims, 11 Drawing Sheets

Measured number of residual contamination particles on wafer bottom surface after post-cleaning process invention : pre-cleaning process has been carried out with a solution containing NHO3, H2O2 and H2O prior art : pre-cleaning process has been carried out with a solution containing HF, H2O2, and H2O

METHOD OF FORMING A SEMICONDUCTOR DEVICE BY SIMULTANEOUSLY CLEANING BOTH SIDES OF A WAFER USING DIFFERENT CLEANING SOLUTIONS

The present invention relates to a method of forming a semiconductor device, and more particularly to a method of forming a semiconductor device having Cu-films serving as electrodes and interconnections as well as a cleaning method for avoiding the semiconductor device from Cu-metal contamination.

Cu is available as a conductive film for an electrode or an interconnection in a semiconductor device. FIG. 1 is a fragmentary cross sectional elevation view illustrative of a semiconductor device having Cu-interconnections to describe the conventional method of forming the semiconductor device. A semiconductor substrate 9 has a transistor not illustrated on a surface thereof. An inter-layer insulator 2 is then formed on the semiconductor substrate 9. Interconnections 8 are formed in the inter-layer insulator 2. The interconnections 8 are separated by the inter-layer insulator 2 from the semiconductor substrate 9. Each of the interconnections 8 may be formed as follows. Interconnection grooves 3 are selectively formed in the inter-layer insulator 2 by a selective etching process to the inter-layer insulator 2. A barrier metal layer 4 of TaN, Ta or TiN is deposited by a sputtering method. A seed Cu-layer 5 is also deposited on the barrier metal layer 4 by a sputtering method. A Cu-plating process is carried out to grow the seed Cu-layer up 5 up to a Cu-plated layer 6 which completely fill the interconnection grooves 3. The Cu-plated layer 6 comprises a moisture-containing polycrystal. An anneal is carried out to case a crystallization so that the moisture-containing polycrystal Cu-plated layer 6 becomes a single crystal Cu-layer 6 thereby to form a wafer. A chemical mechanical polishing is carried out to selectively remove the barrier metal layer 4, the seed Cu-layer 5 and the Cu-plated layer 6 to leave them within the interconnection grooves 3, whereby a planarized top surface of the inter-layer insulator 2 is shown, thereby to form interconnections 8 within the interconnection grooves 3. A cleaning process is then carried out to the wafer 1 in order to remove the used polishing agent and contaminations of metals such as Cu from the surface of the wafer 1.

In the Cu-plating process, Cu is grown not only on the top surface of the wafer 1 but also on the bottom surface thereof. Further, Cu atoms are adhered on the bottom surface of the semiconductor substrate 9 and then diffused into the semiconductor substrate 9, whereby the diffused Cu atoms serve as contamination which deteriorates the device performance and characteristics. In order to prevent this problem, a pre-cleaning process is carried out to remove the Cu-metal contamination from the bottom surface of the semiconductor substrate 9. The known pre-cleaning process is an RCA cleaning method which uses a cleaning solution such as FPM ($HF/H_2O_2/H_2$). The bottom surface of the wafer 1 is cleaned with the FPM to remove not only the Cu-metal contamination therefrom but also a silicon oxide film on the bottom surface of the wafer, whereby the bottom surface of the wafer becomes hydrophobic. The wafer is also cleaned after the chemical mechanical polishing process. However, the cleaning solution is not uniformly in contact with the bottom surface of the wafer, thereby deteriorating the cleaning effect. Further, if the FPM cleaning solution is once in contact with the Cu-interconnections, this causes dissolution and/or corrosion of a surface of the Cu-interconnections, resulting in that the resistance of the interconnection is increased or the interconnection is disconnected.

In order to obtain the effect of cleaning the wafer after the chemical mechanical polishing process, it is preferable that the wafer bottom surface is hydrophilic. The contamination by the chemical mechanical polishing process is in the form of an insulator, for example, slurry, which is like to adhere onto the hydrophobic silicon surface due to opposite electrical polarity. If, however, the silicon surface is oxidized to change the property to a hydrophilic property, then the contamination insulator is unlikely to be adhered onto the hydrophilic silicon oxide surface. In Japanese patent No. 2586319, it is disclosed that $O_2$ plasma treatment is carried out to form a silicon oxide film on the wafer bottom surface so that the wafer bottom surface has the hydrophilic property. The $O_2$ plasma treatment is effective to a wafer having a refractory metal interconnection structure, but ineffective to the wafer having Cu-interconnection structure because Cu is oxidized by $O_2$ plasma, thereby to increase the resistance of the Cu-interconnection.

As described above, the wafer bottom surface is subjected to the Cu-contamination in the Cu-plating process. The Cu-contamination deteriorates the device performances or characteristics. If to remove the Cu-contamination, the FPM cleaning solution containing HF is used, then the wafer surface, except for the Cu-plated layer becomes hydrophobic, thereby making it difficult to remove the insulative contamination such as slurry adhered in the chemical mechanical polishing process. In order to change the hydrophobic property of the wafer bottom surface into hydrophilic property by the oxygen plasma treatment, the Cu-interconnection is oxidized thereby to increase the resistance of the Cu-interconnection.

In the above circumstances, it had been required to develop a novel method of forming a semiconductor device free from the above problem.

SUMMARY OF THE INVENTION

Accordingly, it is an object of the present invention to provide a novel method of forming a semiconductor device free from the above problems.

It is a further object of the present invention to provide a novel method of forming a semiconductor device, which allows removing Cu-contamination from a wafer bottom surface and also changing the wafer bottom surface to have a hydrophilicity.

The first present invention provides a method of removing a Cu-contamination from a wafer surface having a Cu-based metal region, comprising the step of: carrying out a cleaning process by use of a cleaning solution free of HF and capable of oxidation of the wafer surface for not only removing the Cu-contamination from the wafer surface but also oxidizing the wafer surface to cause the wafer surface to have a hydrophilicity.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
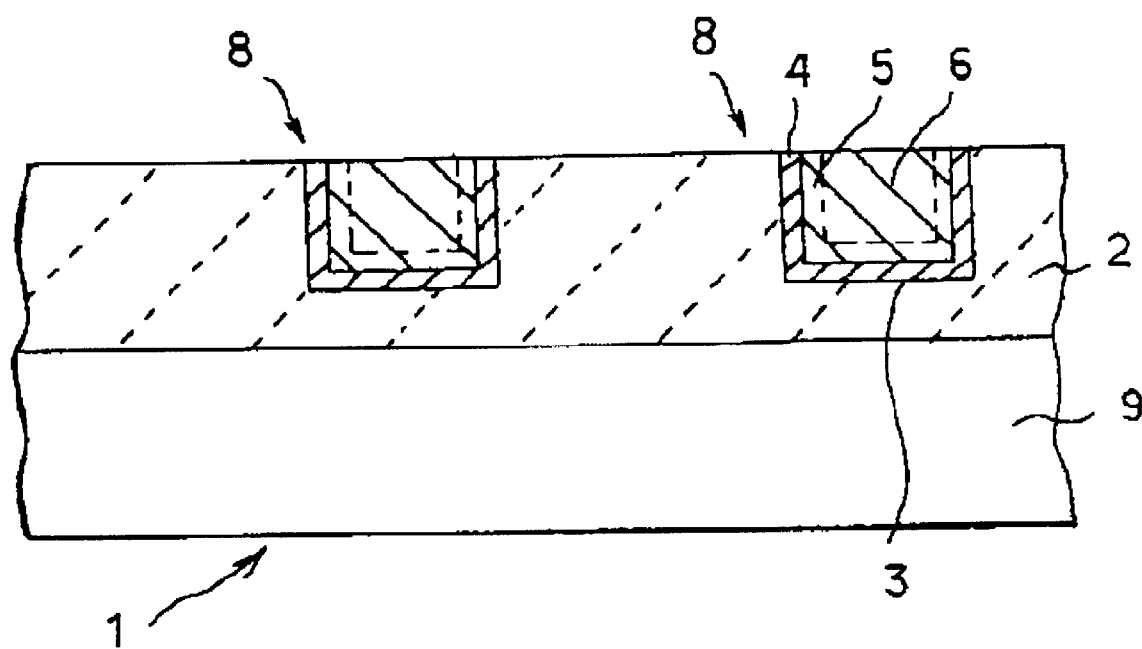
FIG. 1 is a fragmentary cross sectional elevation view illustrative of a semiconductor device having Cu-interconnections to describe the conventional method of forming the semiconductor device.

The first present invention provides a method of removing a Cu-contamination from a wafer surface having a Cu-based metal region, comprising the step of: carrying out a cleaning process by use of a cleaning solution free of HF and capable of oxidation of the wafer surface for not only removing the Cu-contamination from the wafer surface but also oxidizing the wafer surface to cause the wafer surface to have a hydrophilicity.

It is preferable that the cleaning solution comprise one solution selected from the group consisting of a solution containing $HNO_3$, $H_2O_2$ and $H_2O$, a solution containing (HPM) HCl, $H_2O_2$, and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone.

It is also preferable that the Cu-based metal region is, protected from the cleaning solution by an additional protection treatment. It is further preferable that the additional protection treatment is carried out by injecting a pure-water to the Cu-based metal region. It is also preferable that the additional protection treatment is carried out by injecting an organic acid solution to the Cu-based metal region. It is further preferable that the organic acid is capable of removing a surface oxide film from a surface of the Cu-based metal region.

It is also preferable that the additional protection treatment is carried out by blowing an inert gas to the Cu-based metal region.

It is preferable to further comprise the steps of: carrying out a chemical mechanical polishing process; and carrying out a post-cleaning process for removing contaminations adhered on the wafer surface during the chemical mechanical polishing process.

It is further preferable that the post-cleaning process comprises the steps of: subjecting the wafer surface to any one of a diluted ammonium solution, an electrolytic cathode water, and a hydrogen-dissolved water; and subjecting the top surface of the wafer to oxalic acid and the bottom surface of the wafer to at least one solution selected from the group consisting of a solution containing HF, $H_2O_2$, and $H_2O$, and an oxalic acid solution.

The second present invention provides a method of removing Cu-contamination from a wafer surface having a Cu-based metal region, comprising the steps of: carrying out a cleaning process for removing the Cu-contamination from the wafer surface by use of a first cleaning solution; and carrying out a hydrophilic treatment to the wafer surface by use of a second cleaning solution for changing the wafer surface to have a hydrophilicity.

It is preferable that the first cleaning solution contains HF, and the second cleaning solution is free of HF and capable of oxidation of the wafer surface. It is further preferable that the first cleaning solution contains a solution containing HF, $H_2O_2$, and $H_2O$.

It is also preferable that the second cleaning solution contains one solution selected from the group consisting of an ozone water, a hydrogen peroxide water, a solution containing $HNO_3$, $H_2O_2$ and $H_2O$, a solution containing (HPM) HCl, $H_2O_2$, and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone as well as a solution containing both hydrogen peroxide and sulfuric acid, a solution containing both hydrogen peroxide and nitric acid, and a solution containing both hydrogen peroxide and hydrochloric acid.

It is preferable to further comprise the steps of: carrying out a chemical mechanical polishing process after the hydrophilic treatment has been carried out; and carrying out a post-cleaning process for removing an insulative contamination adhered on the wafer surface during the chemical mechanical polishing process. It is preferable that the post-cleaning process comprises the steps of: subjecting the wafer surface to any one of a diluted ammonium solution, an electrolytic cathode water, and a hydrogen-dissolved water; and subjecting the top surface of the wafer to oxalic acid and the bottom surface of the wafer to at least one solution selected from the group consisting of a solution containing HF, $H_2O_2$, and $H_2O$, and an oxalic acid solution.

The third present invention provides a method of forming a semiconductor device comprising the steps of: forming a Cu-based metal layer on a top surface of a wafer so that the Cu-based metal layer completely fills at least one groove formed in the top surface of the wafer; carrying out a pre-cleaning process by use of a pre-cleaning solution free of HF and capable of oxidation to the wafer surface for not only removing Cu-contamination from a bottom surface of the wafer but also oxidizing the bottom surface of the wafer to cause the bottom surface of the wafer to have a hydrophilicity; annealing the wafer; carrying out a chemical mechanical polishing for polishing the Cu-based metal layer to leave the Cu-based metal layer only within the at least one groove; and carrying out a post-cleaning process using at least one post-cleaning solution for removing contaminations adhered on the wafer surface during the chemical mechanical polishing process.

It is preferable that the pre-cleaning solution comprise one solution selected from the group consisting of a solution containing $HNO_3$, $H_2O_2$ and $H_2O$, a solution containing (HPM) HCl, $H_2O_2$ and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone.

It is also preferable that the Cu-based metal region is protected from the cleaning solution by an additional protection treatment. It is further preferable that the additional protection treatment is carried out by injecting a pure water to the Cu-based metal region.

It is also preferable that the additional protection treatment is carried out by injecting an organic acid solution to the Cu-based metal region. It is further preferable that the organic acid is capable of removing a surface oxide film from a surface of the Cu-based metal region.

It is also preferable that the additional protection treatment is carried out by blowing an inert gas to the Cu-based metal region.

It is preferable that the post-cleaning process further comprises the steps of: subjecting the wafer surface to any one of a diluted ammonium solution, an electrolytic cathode water, and a hydrogen-dissolved water; and subjecting the top surface of the wafer to oxalic acid and the bottom surface of the wafer to at least one solution selected from the group consisting of a solution containing HF, $H_2O_2$, and $H_2O$, and an oxalic acid solution.

The fourth present invention provides a method of forming a semiconductor device comprising the steps of: forming a Cu-based metal layer on a top surface of a wafer so that the Cu-based metal layer completely fills at least one groove formed in the top surface of the wafer; carrying out a first pre-cleaning process for removing the Cu-contamination from the wafer surface by use of a first pre-cleaning solution; carrying out a second pre-cleaning process to the wafer surface by use of a second pre-cleaning solution for oxidizing the bottom surface of the wafer to cause the bottom surface of the wafer to have a hydrophilicity; annealing the wafer; carrying out a chemical mechanical polishing for polishing the Cu-based metal layer to leave the Cu-based metal layer only within the at least one groove; and carrying out a post-cleaning process by use of at least one post-cleaning solution for removing contaminations adhered on the wafer surface during the chemical mechanical polishing process.

It is preferable that the first pre-cleaning solution contains HF, and the second pre-cleaning solution is free of HF and capable of oxidation to the wafer surface. It is further preferable that the first pre-cleaning solution contains a solution containing HF, $H_2O_2$, and $H_2O$.

It is also preferable that the second pre-cleaning solution contains one solution selected from the group consisting of an ozone water, a hydrogen peroxide water, a solution containing $HNO_3$, $H_2O_2$ and $H_2O$, a solution containing (HPM) HCl, $H_2O_2$ and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone as well as a solution containing both hydrogen peroxide and sulfuric acid, a solution containing both hydrogen peroxide and nitric acid, and a solution containing both hydrogen peroxide and hydrochloric acid.

It is also preferable that the post-cleaning process comprises the steps of: subjecting the wafer surface to any one of a diluted ammonium solution, an electrolytic cathode water, and a hydrogen-dissolved water; and subjecting the top surface of the wafer to oxalic acid and the bottom surface of the wafer to at least one solution selected from the group consisting of a solution containing HF, $H_2O_2$, and $H_2O$, and an oxalic acid solution.

In accordance with the present invention, a hydrophilic treatment is carried out for changing a wafer bottom surface to have a hydrophilicity at the same time when Cu-contamination is removed from the wafer bottom surface, wherein a cleaning solution for removing the Cu-contamination is free of HF and capable of oxidation of the wafer bottom surface.

The available cleaning solution may be one of a solution containing $HNO_3$, $H_2O_2$ and $H_2O$, a solution containing (HPM) HCl, $H_2O_2$, and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone. The cleaning solution is injected to the wafer surface except to a surface of the Cu-plated layer and concurrently a passivation or protection process is carried out to the surface of the Cu-plated layer. The passivation or protection process is carried out by injecting a pure water or an organic acid to the wafer surface or by blowing a nitrogen gas thereto. The organic acid may preferably be capable of removing the surface oxide layer from the surface of the Cu-plated layer.

In accordance with the present invention, a hydrophilic treatment is carried out for changing a wafer bottom surface to have a hydrophilicity after Cu-contamination has been removed by an HF-containing cleaning solution from the wafer bottom surface, wherein a cleaning solution for removing the Cu-contamination is free of HF and capable of oxidation of the wafer bottom surface.

The available HF-containing cleaning solution may be FPM. The cleaning solution for the hydrophilic treatment may be one of a solution containing $HNO_3$, $H_2O_2$ and $H_2O$, a solution containing (HPM) HCl, $H_2O_2$, and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone as well as a solution containing both hydrogen peroxide and sulfuric acid, a solution containing both hydrogen peroxide and nitric acid, and a solution containing both hydrogen peroxide and hydrochloric acid.

After the hydrophilic treatment has been carried out, a chemical mechanical polishing process and a subsequent post-cleaning process are carried out. The post-cleaning process may preferably comprise a first cleaning step of subjecting the wafer surface to a diluted ammonium solution, an electrolytic cathode water, a hydrogen-dissolved water and a second cleaning step of subjecting the top surface of the wafer to oxalic acid and the bottom surface of the wafer to either FPM or oxalic acid.

PREFERRED EMBODIMENT

A first embodiment according to the present invention will be described in detail with reference to the drawings. FIGS. 2A through 2D are fragmentary cross sectional elevation views illustrative of semiconductor devices having Cu-interconnections in sequential steps involved in a novel formation method in a first preferred embodiment in accordance with the present invention.

Figure 2A:
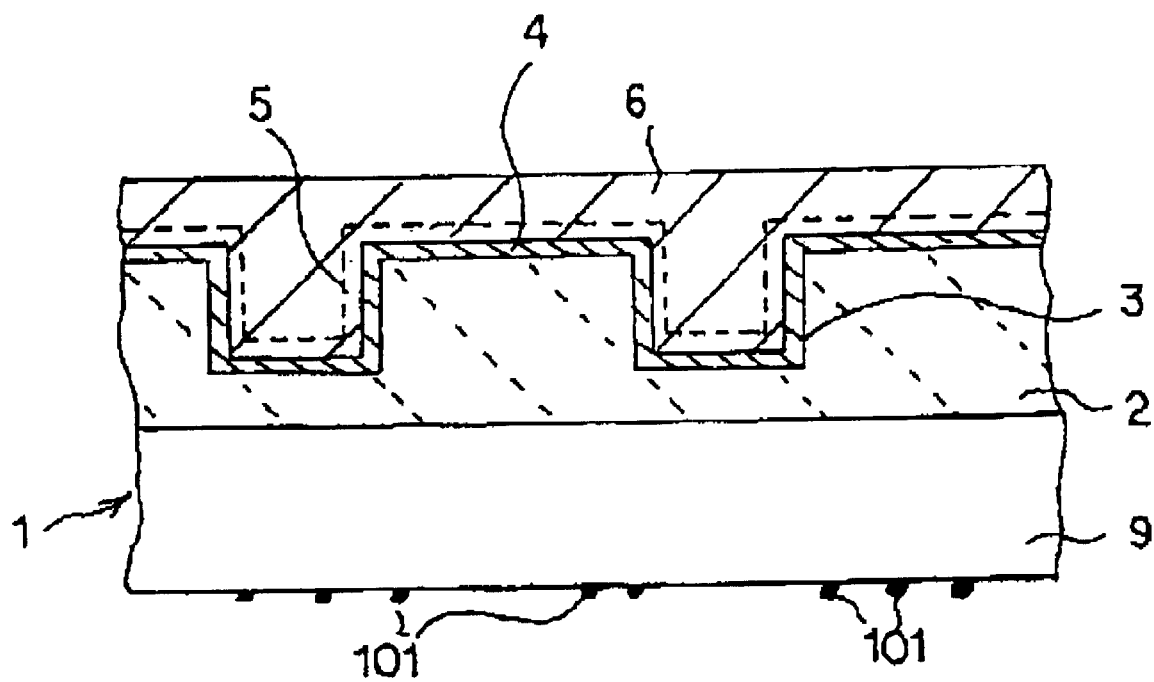
FIGS. 2A through 2D are fragmentary cross sectional elevation views illustrative of semiconductor devices having Cu-interconnections in sequential steps involved in a novel formation method in a first preferred embodiment in accordance with the present invention.

With reference to FIG. 2A, a semiconductor substrate 9 has a transistor not illustrated on a surface thereof. An inter-layer insulator 2 is then formed on the semiconductor substrate 9. Interconnection grooves 3 are selectively formed in the inter-layer insulator 2 by a selective etching process to the inter-layer insulator 2. A barrier metal layer 4 of TaN, Ta or TiN is deposited by a sputtering method. A seed Cu-layer 5 is also deposited on the barrier metal layer 4 by a sputtering method. A Cu-plating process is carried out to grow the seed Cu-layer 5 up to a Cu-plated layer 6 which completely fill the interconnection grooves 3. As a result, a Cu-contamination 101 is adhered on the bottom surface of the wafer 1.

Figure 2B:
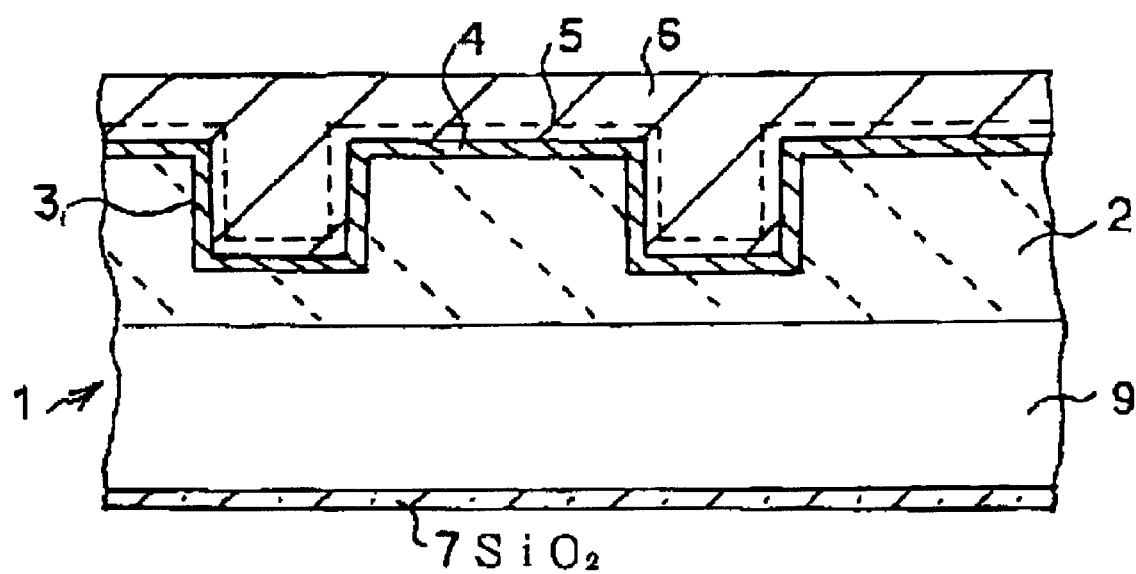
Figure 2C:
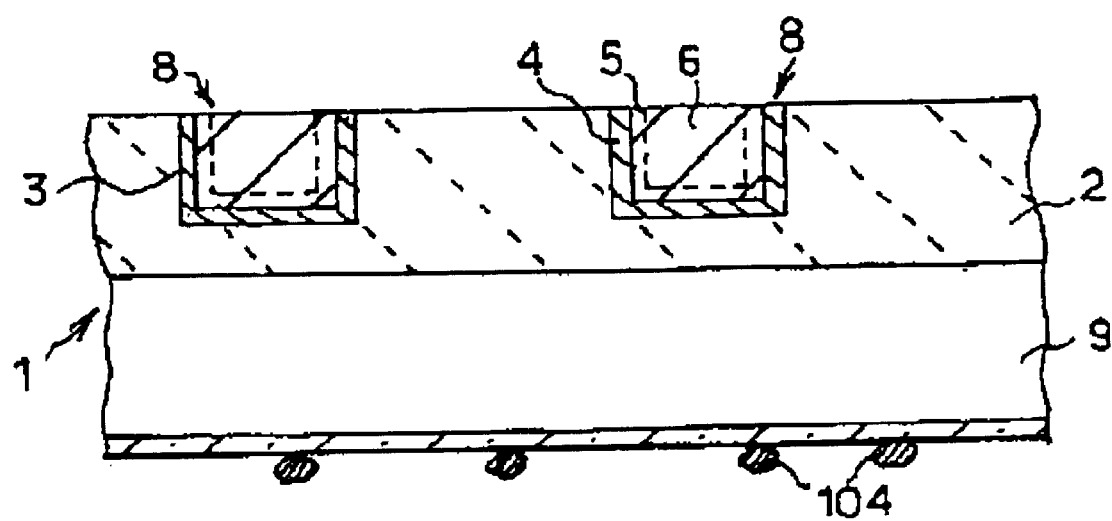
Figure 3:
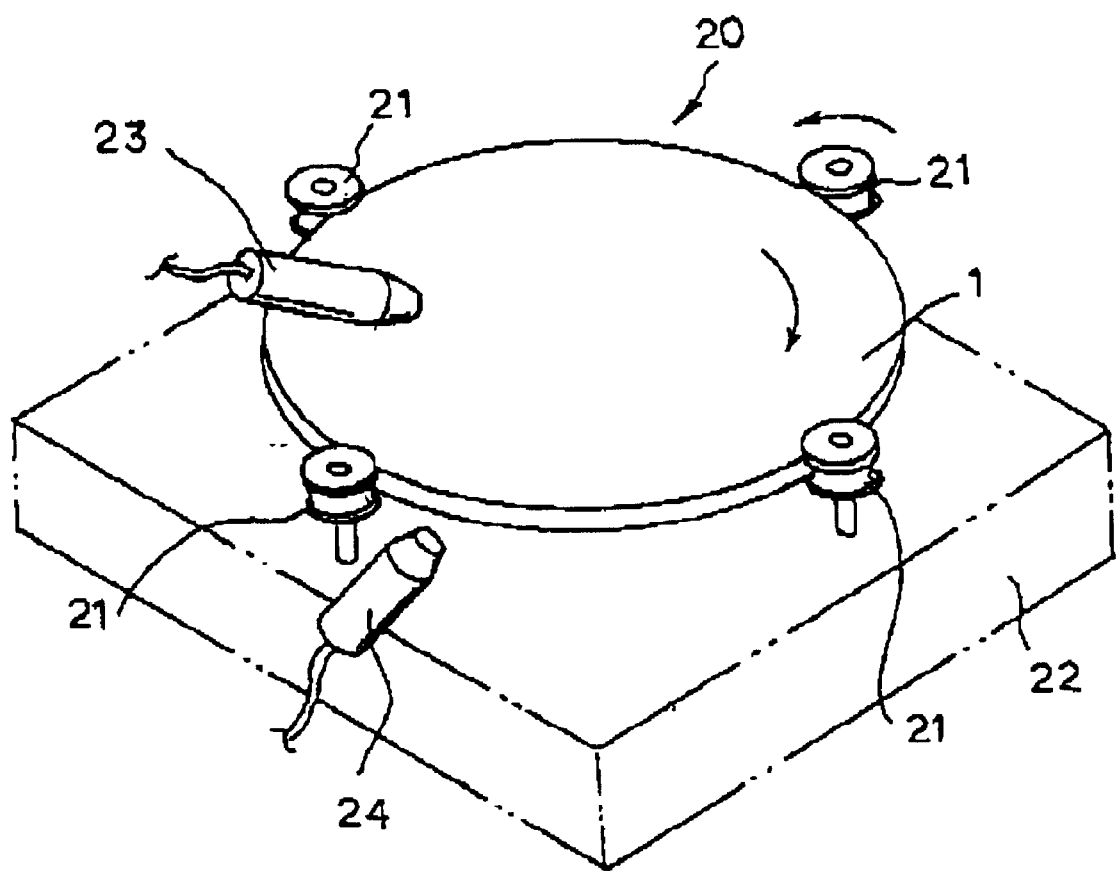
FIG. 3 is a schematic view illustrative of a pre-cleaning apparatus to be used for the pre-cleaning process for removing the Cu-contamination from the bottom surface of the wafer in the first embodiment in accordance with the present invention.
Figure 4:
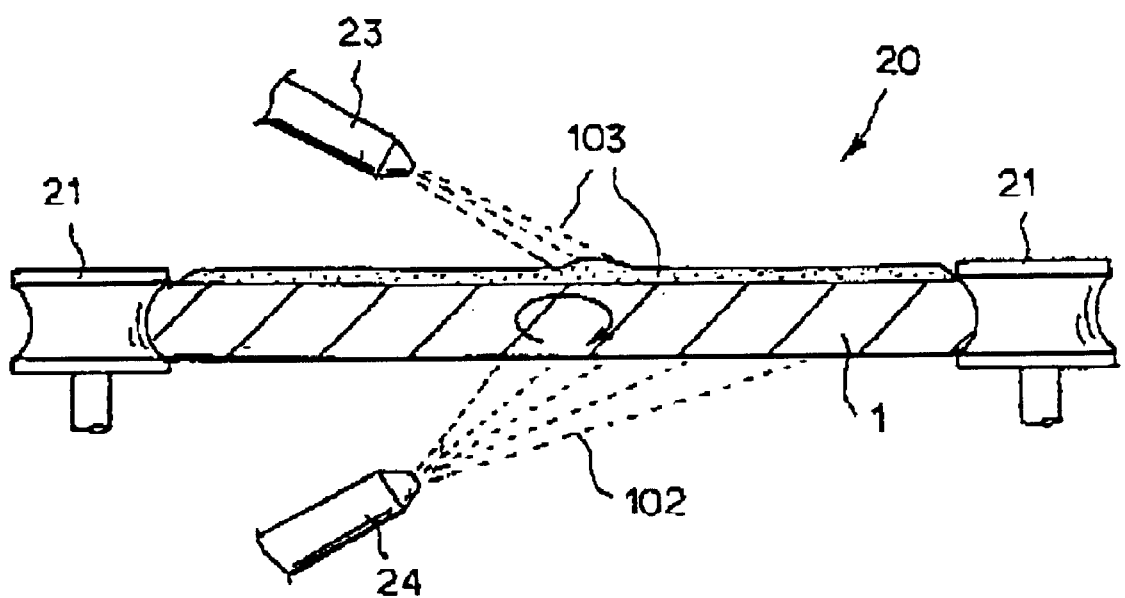
FIG. 4 is a fragmentary enlarged cross sectional elevation view illustrative of the pre-cleaning process for cleaning a wafer in a preferred embodiment in accordance with the present invention.

With reference to FIG. 2B, a wafer pre-cleaning process is carried out for removing the Cu-contamination 101 from the bottom surface of the wafer 1. FIG. 3 is a schematic view illustrative of a pre-cleaning apparatus to be used for the pre-cleaning process for removing the Cu-contamination from the bottom surface of the wafer-in the first embodiment in accordance with the present invention. The wafer 1 is placed on a pre-cleaning apparatus 20 shown in FIG. 3. The pre-cleaning apparatus 20 has a plurality of rollers 21 which are provided along a circumference of the wafer 1 so that the rollers 21 are securely in contact with the circumference of the wafer 1. A first injection nozzle 23 is provided for injecting a cleaning solution on a top surface of the wafer 1. A second injection nozzle 24 is also provided for injecting the cleaning solution on a bottom surface of the wafer 1. The wafer 1 is rotated by a unidirectional co-rotation of the plural rollers 21 at the same rotation speed, during which different cleaning solutions are respectively injected to the top and bottom surfaces of the wafer 1 from the first and second injection nozzles 23 and 24. The unidirectional co-rotation of the plural rollers 21 at the same rotation speed is driven by a driver 22. FIG. 4 is a fragmentary enlarged cross sectional elevation view illustrative of the pre-cleaning process for cleaning a wafer in a preferred embodiment in accordance with the present invention. A first pre-cleaning solution 103 is injected from the first injection nozzle 23 to a center region of the top surface of the wafer 1, whilst a second pre-cleaning solution 102 is injected from the second injection nozzle 24 to a wide region of the bottom surface of the wafer 1. The second cleaning solution 24 is free of HF and capable of oxidizing the bottom surface of the wafer 1. For example, the second cleaning solution 102 may be a solution containing $HNO_3$, $H_2O_2$ and $H_2O$, a solution containing (HPM) HCl, $H_2O_2$, and $H_2O$, or a solution containing (SPM) $H_2SO_4$, $H_2O_2$, and $H_2O$. The first cleaning solution 103 may be pure water or an organic acid solution such as oxalic acid solution and malonic acid solution. The second cleaning solution 102 removes the Cu-contamination 101 from the bottom surface of the wafer 1, and also oxidizes the bottom surface of the wafer 1 to form a thin oxide film 7 on the bottom surface of the wafer 1. Since the second cleaning solution 102 is free of HF, the formation of the thin oxide film 7 is allowed. The thin oxide film 7 is hydrophilic, whilst the bottom surface of the wafer 1 is hydrophobic. The oxidation of the bottom surface of the wafer 1 changes the hydrophobic property of the wafer bottom surface to become hydrophilic. The second cleaning solution may include $HNO_3$ only, provided that a concentration is not less than 5%. The second cleaning solution 102 may also be a sulfuric acid solution dissolved with ozone, a nitric acid solution dissolved with ozone or a hydrochloric acid solution dissolved with ozone. If the second cleaning solution 102 is the solution containing $HNO_3$, $H_2O_2$ and $H_2O$, the Cu-contamination 101 is dissolved into the second cleaning solution 102 and removed from the bottom surface of the wafer 1. The first cleaning solution 103 coats the top surface of the wafer 1 so that the top surface of the wafer 1 is prevented form being oxidized by the second cleaning solution 102. If the first cleaning solution 103 is the organic acid solution, the first cleaning solution 103 not only prevents the top surface of the wafer 1 from the oxidation by the second cleaning solution 102 but also removes a Cu-oxide film from the Cu-plated film 6.

Subsequently, an anneal is carried out to cause a crystallization so that the moisture-containing polycrystal Cu-plated layer 6 becomes a single crystal Cu-layer 6 thereby to form a wafer.

With reference back to FIG. 2C, a chemical mechanical polishing is carried out to selectively remove the barrier metal layer 4, the seed Cu-layer 5 and the Cu-plated layer 6 to leave them within the interconnection grooves 3, whereby a planarized top surface of the inter-layer insulator 2 is shown, thereby to form interconnections 8 within the interconnection grooves 3. As a result of this chemical mechanical polishing, second contaminations 104, for example, Cu particles, alumina particles and silica particles as the polishing agent are adhered on the wafer surface.

Figure 2D:
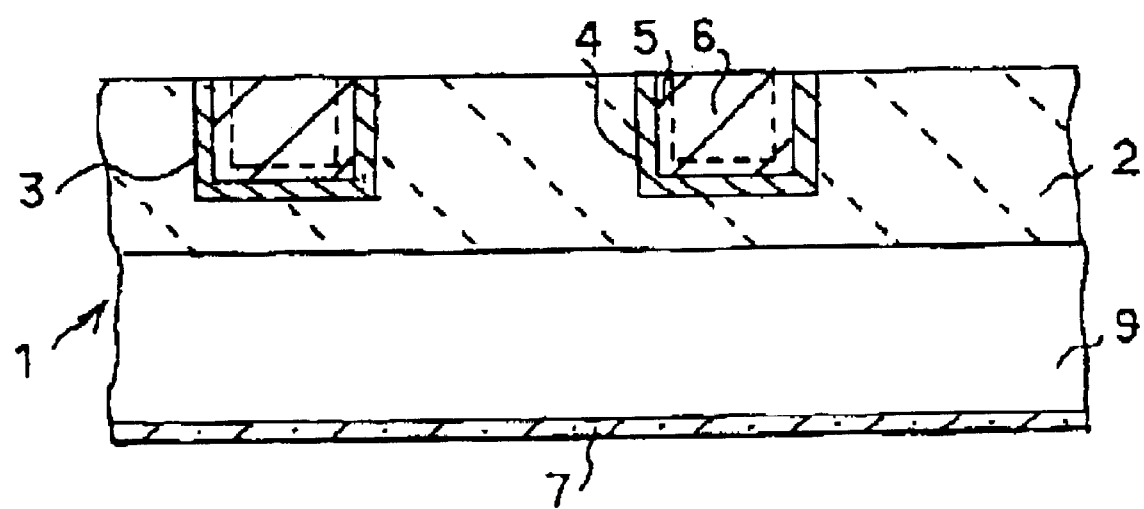
Figure 5:
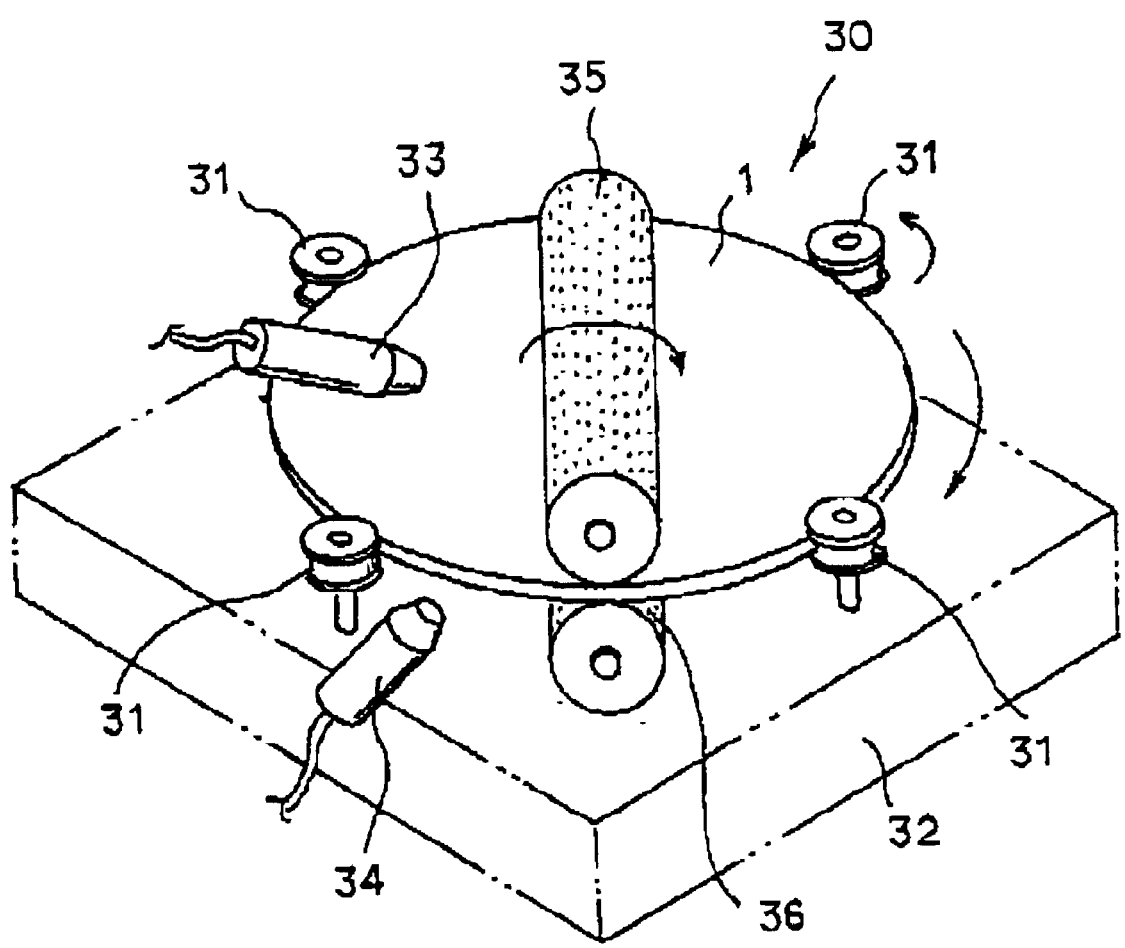
FIG. 5 is a schematic perspective view illustrative of a post-cleaning apparatus to be used in a post-cleaning process in a novel method of forming the semiconductor device in a preferred embodiment in accordance with the present invention.

With reference to FIG. 2D, a post-cleaning process is then carried out to the wafer 1 in order to remove the second contaminations 104 from the wafer surface. FIG. 5 is a schematic perspective view illustrative of a post-cleaning apparatus to be used in a post-cleaning process in a novel method of forming the semiconductor device in a preferred embodiment in accordance with the present invention. The wafer 1 is placed on a post-cleaning apparatus 30 shown in FIG. 5. The post-cleaning apparatus 30 has a plurality of rollers 31 which are provided along a circumference of the wafer 1 so that the rollers 31 are securely in contact with the circumference of the wafer 1. A first injection nozzle 33 is provided for injecting a cleaning solution on a top surface of the wafer 1. A second injection nozzle 34 is also provided for injecting the cleaning solution on a bottom surface of the wafer 1. The wafer 1 is rotated by a unidirectional co-rotation of the plural rollers 31 at the same rotation speed, during which different cleaning solutions are respectively injected to the top and bottom surfaces of the wafer 1 from the first and second injection nozzles 33 and 34. The unidirectional co-rotation of the plural rollers 31 at the same rotation speed is driven by a driver 32. Further, a first roll brush 35 is provided in contact with the top surface of the wafer 1 and a second roll brush 36 is provided in contact with the bottom surface of the wafer 1. The entire regions of the top and bottom surfaces of the wafer 1 are in contact with the first and second roll brushes 35 and 36 upon rotation of the wafer 1.

Figure 6:
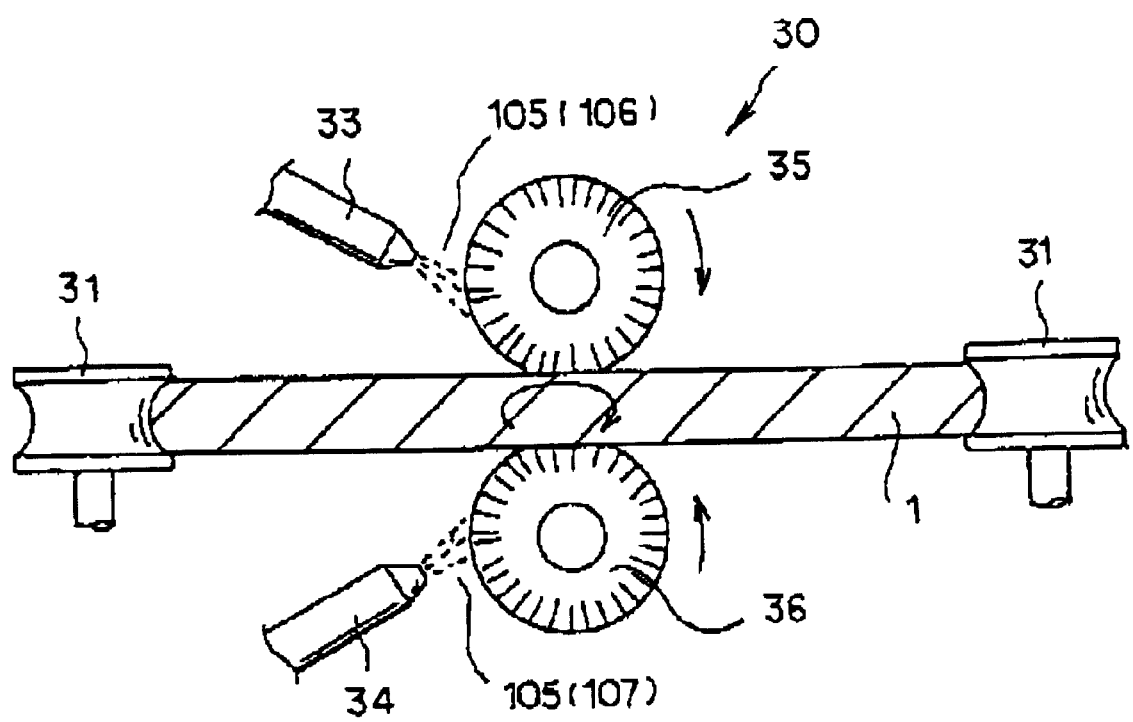
FIG. 6 is a fragmentary enlarged cross sectional elevation view illustrative of the first step involved in the post-cleaning process for cleaning a wafer in a preferred embodiment in accordance with the present invention.

The post-cleaning process comprises first and second steps. In the first step, a diluted aqueous ammonium of 0.01 wt % is used with the first and second roll brushes 35 and 36 for removing the polishing agent such as alumina or silica particles. FIG. 6 is a fragmentary enlarged cross sectional elevation view illustrative of the first step involved in the post-cleaning process for cleaning a wafer in a preferred embodiment in accordance with the present invention. A cleaning solution 105 is injected from the first and second injection nozzles 33 and 34 to the first and second roll brushes 35 and 36, so that the top and bottom surfaces of the wafer 1 are cleaned with the first and second roll brushes 35 and 36. The cleaning solution 105 may be any one of a diluted ammonium solution, an electrolytic cathode water, and a hydrogen-dissolved water, a pure water, an aqueous ammonium. The cleaning solution 105 is then rinsed by a pure water from the top and bottom surfaces of the wafer 1. In a second step, in order to remove the metal contaminations such as Cu particles, K, Ca and Fe, the top surface of the wafer 1 is subjected to an oxalic acid solution 106 and the bottom surface of the wafer 1 is subjected to a solution 107 containing HF, $H_2O_2$, and $H_2O$, and an oxalic acid solution. The cleaning solutions 106 and 107 are then rinsed by the pure water.

In the first step, diluted ammonium solution is selected to avoid that the Cu-plated film 6 is etched or is formed with pits. In the second step, the oxalic acid solution is selected to avoid that the Cu-plated film 6 is etched.

Consequently, the above sequential processes are, for example, the Cu-plating process, the pre-cleaning process, the annealing process, the Cu-plating process, the pre-cleaning process, the annealing process, the chemical mechanical polishing process, and the post-cleaning process.

Figure 7:
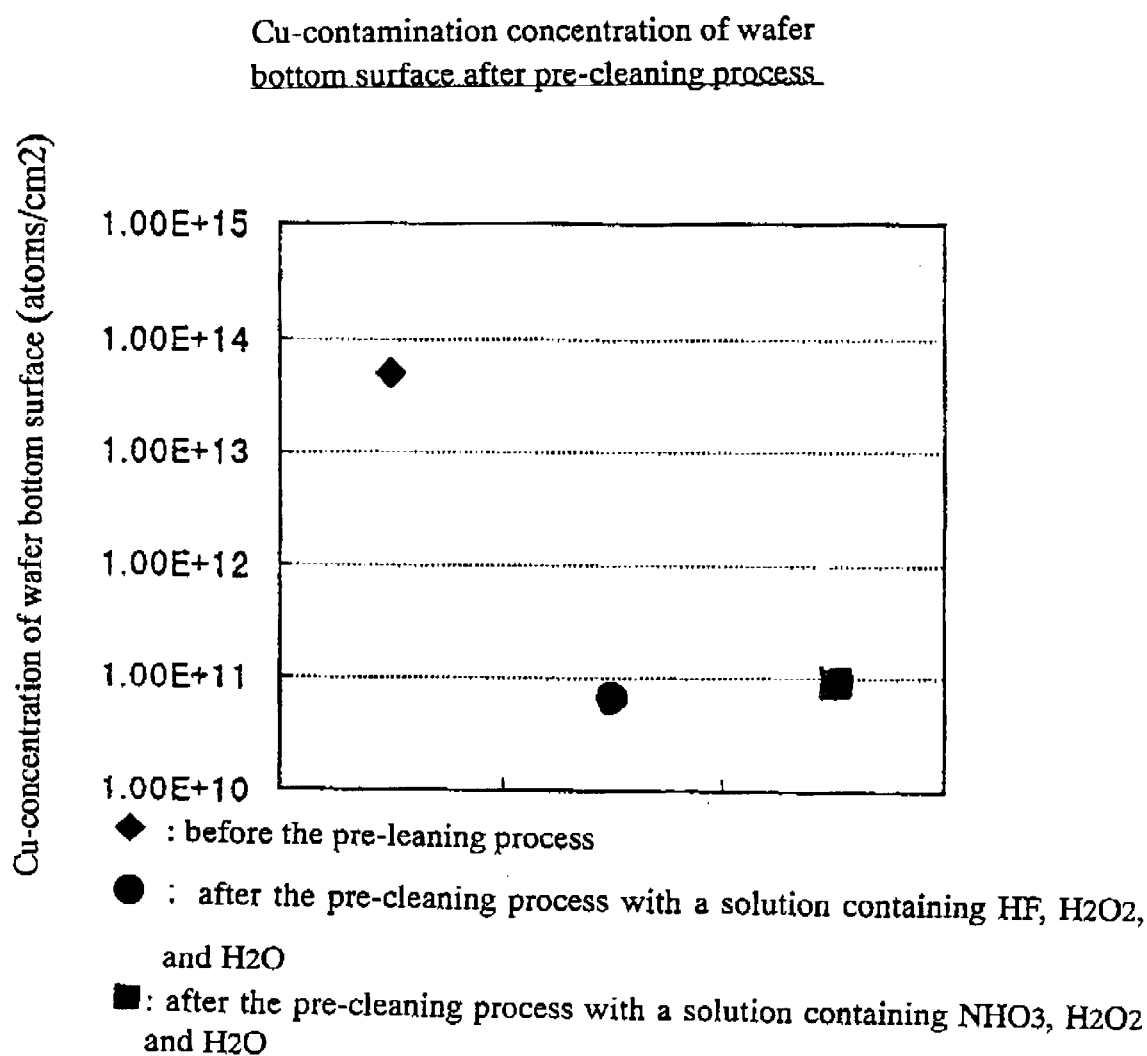
FIG. 7 is a diagram illustrative of measured Cu-contamination concentrations of a wafer bottom surface before the pre-cleaning process, after the pre-cleaning process with a solution containing HF, $H_2O_2$, and $H_2O$ and after the pre-cleaning process with a solution containing $HNO_3$, $H_2O_2$ and $H_2O$.

FIG. 7 is a diagram illustrative of measured Cu-contamination concentrations of a wafer bottom surface before the pre-cleaning process (represented by ◆), after the pre-cleaning process with a solution containing HF, $H_2O_2$, and $H_2O$ (represented by ●) and after the pre-cleaning process with a solution containing $HNO_3$, $H_2O_2$ and $H_2O$ (represented by ■). Before the pre-cleaning process, the measured Cu-contamination concentration of the wafer bottom surface is about 1.0E+14(atoms/$cm_2$). After the pre-cleaning process with a solution containing HF, $H_2O_2$, and $H_2O$, the measured Cu-contamination concentration of the wafer bottom surface is less than about 1.0E+11(atoms/$cm_2$). After the pre-cleaning process with a solution containing $HNO_3$, $H_2O_2$, and $H_2O$, the measured Cu-contamination concentration of the wafer bottom surface is about 1.0E+11(atoms/$cm_2$). The pre-cleaning solution containing $HNO_3$, $H_2O_2$, and $H_2O$ has as high a cleaning capability as the cleaning solution containing HF, $H_2O_2$, and $H_2O$.

Figure 8:
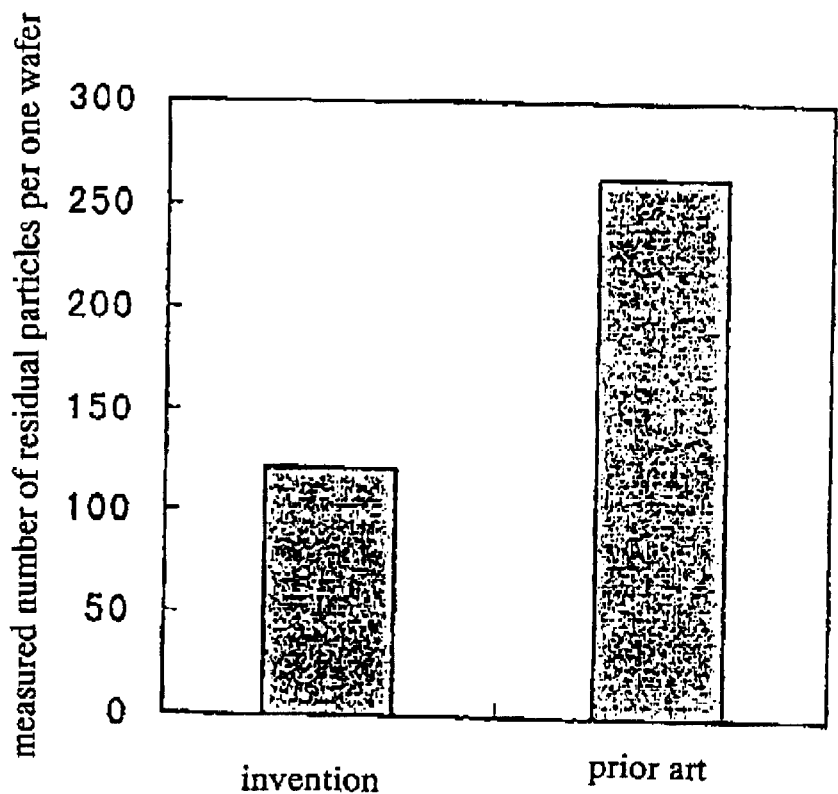
FIG. 8 is a diagram illustrative of measured numbers of residual Cu atoms as Cu-contamination on the wafer bottom surface after the post-cleaning process when the pre-cleaning process has been carried out with a solution containing HF, $H_2O_2$, and $H_2O$ and when the pre-cleaning process has been carried out with a solution containing $HNO_3$, $H_2O_2$ and $H_2O$.

FIG. 8 is a diagram illustrative of measured numbers of residual Cu atoms as Cu-contamination on the wafer bottom surface after the post-cleaning process when the pre-cleaning process has been carried out with a solution containing HF, $H_2O_2$, and $H_2O$ and when the pre-cleaning process has been carried out with a solution containing $HNO_3$, $H_2O_2$ and $H_2O$. If the pre-cleaning process has been carried out with a solution containing HF, $H_2O_2$, and $H_2O$ in accordance with the conventional technique, the measured number of residual Cu atoms as Cu-contamination on the wafer bottom surface after the post-cleaning process is 250 atoms per one wafer. If the pre-cleaning process has been carried out with a solution containing $HNO_3$, $H_2O_2$ and $H_2O$, the measured number of residual Cu atoms as Cu-contamination on the wafer bottom surface after the post-cleaning process is 120 atoms per one wafer.

As a modification to the above pre-cleaning process, it is possible that the pre-cleaning process is carried out by two steps. In the first pre-cleaning step, the first pre-cleaning solution 103 is injected from the first injection nozzle 23 to the center region of the top surface of the wafer 1, whilst the second pre-cleaning solution 102 is injected from the second injection nozzle 24 to the wide region of the bottom surface of the wafer 1, wherein the second pre-cleaning solution 102 is FPM for removing the Cu-contaminations 101 from the wafer bottom surface, whilst the first pre-cleaning solution 103 is pure water or an organic acid solution such as oxalic acid solution and malonic acid solution for coating the top surface of the wafer 1 to prevent the top surface of the wafer 1 from the second pre-cleaning solution 102 of FPM. In the second pre-cleaning step, the second pre-cleaning solution 102 is injected from the second injection nozzle 24 to the wide region of the bottom surface of the wafer 1, wherein the second pre-cleaning solution 102 is free of HF and capable of oxidizing the bottom surface of the wafer 1 to oxidize the bottom surface of the wafer 1 to form a thin oxide film 7 on the bottom surface of the wafer 1. For example, the second cleaning solution 102 may be a solution containing $HNO_3$, $H_2O_2$ and $H_2O$, a solution containing (HPM) HCl, $H_2O_2$, and $H_2O$, or a solution containing (SPM) $H_2SO_4$, $H_2O_2$, and $H_2O$. Since the second cleaning solution 102 is free of HF, the formation of the thin oxide film 7 is allowed. The thin oxide film 7 is hydrophilic, whilst the bottom surface of the wafer 1 is hydrophobic. The oxidation of the bottom surface of the wafer 1 changes the hydrophobic property of the wafer bottom surface to have the hydrophilicity.

The Cu-plated film 6 may be pure copper or a copper alloy having not less than 90%-copper concentration, with minority inclusive of aluminum, zirconium, and scandium. In order to prevent the Cu-plated film 6 from contacting the cleaning solution, it is also possible to blow an inert gas such as nitrogen gas.

The present invention is of course applicable to any Cu-based film not only plated but also deposited by a sputtering method or any further available deposition method.

In place of the above pre-cleaning apparatus 20 and the post-cleaning apparatus 30, any apparatuses are available which have substantially the same functions as them.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of removing Cu-contamination from a wafer surface having a Cu-based metal region, comprising the steps of:

removing the Cu-contamination from a top surface of the wafer using a first cleaning solution; and simultaneously applying a second cleaning solution to a bottom surface of the wafer for increasing the hydrophilicity of the bottom surface of the wafer to have a higher hydrophilicity than a substrate of the wafer.

2. The method as claimed in claim 1, wherein the first cleaning solution contains HF, and the second cleaning solution is free of HF and capable of oxidizing the wafer surface.

3. The method as claimed in claim 2, wherein the first cleaning solution contains a solution containing HF, $H_2O_2$, and $H_2O$.

4. The method as claimed in claim 2, wherein the second cleaning solution contains one solution selected from the group consisting of ozonated water, water containing hydrogen peroxide, a solution containing $HNO_3$, $H_2O_2$ and $H_2O$, a solution containing (HPM) HCl, $H_2O_2$, and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone as well as a solution containing both hydrogen peroxide and sulfuric acid, a solution containing both hydrogen peroxide and nitric acid, and a solution containing both hydrogen peroxide and hydrochloric acid.

5. The method as claimed in claim 1, further comprising the steps of:
chemical mechanical polishing the wafer surface after said removing the Cu-contamination step; and
carrying out a post-cleaning process for removing an insulative contamination adhered on the wafer surface during the chemical mechanical polishing step.

6. The method as claimed in claim 5, wherein the post-cleaning process comprises the steps of:
subjecting the wafer surface to any one of a diluted ammonium solution, electrolyzed water processed through a cathode, and water containing dissolved hydrogen; and
subjecting the top surface of the wafer to an oxalic acid solution and the bottom surface of the wafer to at least one solution selected from the group consisting of a solution containing HF, $H_2O_2$, and $H_2O$, and an oxalic acid solution.

7. A method of forming a semiconductor device comprising the steps of:
forming a Cu-based metal layer on a top surface of a wafer so that the Cu-based metal layer completely fills at least one groove formed in the top surface of the wafer;
carrying out a pre-cleaning process by use of a pre-cleaning solution free of HF and capable of oxidizing the wafer surface for not only removing Cu-contamination from a bottom surface of the wafer but also oxidizing the bottom surface of the wafer to cause the bottom surface of the wafer to be more hydrophilic than a substrate of the wafer;
annealing the wafer;
carrying out a chemical mechanical polishing for polishing the Cu-based metal layer to leave the Cu-based metal layer only within the at least one groove; and
carrying out a post-cleaning process by use of at least one post-cleaning solution for removing contaminations adhered on the wafer surface during the chemical mechanical polishing process,
wherein the Cu-based metal region is protected from the cleaning solution by injecting pure water to the Cu-based metal region.

8. A method of forming a semiconductor device comprising the steps of:
forming a Cu-based metal layer on a top surface of a wafer so that the Cu-based metal layer completely fills at least one groove formed in the top surface of the wafer;
carrying out a first pre-cleaning process for removing Cu-contamination from a top surface of the wafer using a first pre-cleaning solution;
simultaneously carrying out a second pre-cleaning process to the wafer surface using a second pre-cleaning solution for oxidizing the bottom surface of the wafer to cause the bottom surface of the wafer to be more hydrophilic than a substrate of the wafer;
annealing the wafer;
carrying out a chemical mechanical polishing for polishing the Cu-based metal layer to leave the Cu-based metal layer only within the at least one groove; and carrying out a post-cleaning process using at least one post-cleaning solution for removing contaminations adhered on the wafer surface during the chemical mechanical polishing process.

9. The method as claimed in claim 8, wherein the first pre-cleaning solution contains HF, and the second pre-cleaning solution is free of HF and capable of oxidizing the wafer surface.

10. The method as claimed in claim 9, wherein the first pre-cleaning solution contains a solution containing HF, $H_2O_2$, and $H_2O$.

11. The method as claimed in claim 9, wherein the second pre-cleaning solution contains a solution selected from the group consisting of ozonated water, water containing hydrogen peroxide, a solution containing $HNO_3$, $H_2O_2$ and $H_2O$, a solution containing (HPM) HCl, $H_2O_2$, and $H_2O$, a solution containing (SPM) $H_2SO_4$, $H_2O_2$, and $H_2O$, a concentrated $HNO_3$ solution, a sulfuric acid solution dissolved with ozone, a nitric acid solution dissolved with ozone and a hydrochloric acid solution dissolved with ozone as well as a solution containing both hydrogen peroxide and sulfuric acid, a solution containing both hydrogen peroxide and nitric acid, and a solution containing both hydrogen peroxide and hydrochloric acid.

12. The method as claimed in claim 8, wherein the post-cleaning process comprises the steps of:
subjecting the wafer surface to any one of a diluted ammonium solution, electrolyzed water processed through a cathode, and water containing dissolved hydrogen; and
subjecting the top surface of the wafer to an oxalic acid solution and the bottom surface of the wafer to at least one solution selected from the group consisting of a solution containing HF, $H_2O_2$, and $H_2O$, and an oxalic acid solution.

13. A method of removing Cu-contamination from a wafer surface having a Cu-based metal region, comprising the steps of:
removing the Cu-contamination from the wafer surface using a first cleaning solution;
applying a second cleaning solution to the wafer surface to increase the hydrophilicity of the wafer surface to have a higher hydrophilicity than a substrate of the wafer;
chemical mechanical polishing the wafer surface after said removing the Cu-contamination step; and
carrying out a post-cleaning process for removing an insulative contamination adhered on the wafer surface during the chemical mechanical polishing step,
wherein the post-cleaning process comprises the steps of:
subjecting the wafer surface to any one of a diluted ammonium solution, electrolyzed water processed through a cathode, and water containing-dissolved hydrogen; and
subjecting the top surface of the wafer to an oxalic acid solution and the bottom surface of the wafer to at least one solution selected from the group consisting of a solution containing HF, $H_2O_2$, and $H_2O$, and an oxalic acid solution.

* * * * *